United States Patent [19]
Rohner

[11] Patent Number: 5,980,979
[45] Date of Patent: Nov. 9, 1999

[54] METHOD FOR CONSISTENTLY FORMING LOW RESISTANCE CONTACT STRUCTURES INVOLVING THE REMOVAL OF ADHESION LAYER PARTICLES BLOCKING VIA OPENINGS

[75] Inventor: Don R. Rohner, Austin, Tex.

[73] Assignee: Advanced Micro Devices, Inc., Sunnyvale, Calif.

[21] Appl. No.: 08/879,577

[22] Filed: Jun. 20, 1997

[51] Int. Cl.$^6$ ........................................................ B05D 5/12
[52] U.S. Cl. ................... 427/97; 427/96; 427/99; 427/126.1; 427/250; 427/346; 427/348; 427/368; 427/419.7; 438/690; 438/691; 438/692; 438/693
[58] Field of Search .................................. 427/96, 97, 99, 427/126.1, 250, 346, 348, 368, 419.7; 438/690, 691, 692, 693

[56] References Cited

U.S. PATENT DOCUMENTS

| | | | |
|---|---|---|---|
| 4,465,716 | 8/1984 | Baber et al. | 427/96 |
| 4,962,414 | 10/1990 | Liou et al. | 437/190 |
| 5,533,923 | 7/1996 | Shamouilian et al. | 451/41 |
| 5,833,817 | 11/1998 | Tsai et al. | 427/97 |

*Primary Examiner*—Shrive Beck
*Assistant Examiner*—Paul D. Strain
*Attorney, Agent, or Firm*—Kevin L. Daffer; Conley, Rose & Tayon

[57] ABSTRACT

A method is presented for consistently forming low resistance contact structures in vias between interconnects. A two-step adhesion layer deposition process with an intermediate particle removing step is employed to ensure sidewalls and bottom surfaces of vias are adequately covered with adhesion layer material prior to via plug formation. Two separate layers of an adhesion layer material (e.g., TiN) are deposited, each layer having a thickness which is adequate for that layer to act as a nucleating surface for subsequently deposited via plug material (e.g., W). The particle removing step is performed following deposition of a first adhesion layer. During the particle removing step, particles of the adhesion layer material are removed from the upper surface of the first adhesion layer, including particles blocking via openings. Following the particle removing step, a second adhesion layer is deposited over the first adhesion layer and any remaining exposed surfaces of the interconnect dielectric layer not covered by the first adhesion layer. The two-step adhesion layer deposition process substantially reduces the probability that a given via will be blocked by an adhesion layer particle. As a result, the two-step deposition process is very effective in ensuring sidewalls and bottom surfaces of vias are adequately covered by adhesion layer material. Fewer high resistance contact structures are formed, and yields of wafer fabrication processes are increased.

23 Claims, 3 Drawing Sheets

METHOD FOR CONSISTENTLY FORMING LOW RESISTANCE CONTACT STRUCTURES INVOLVING THE REMOVAL OF ADHESION LAYER PARTICLES BLOCKING VIA OPENINGS

BACKGROUND OF THE INVENTION

1. Field of the Invention

This invention relates to integrated circuit manufacture and more particularly to a method of consistently forming low resistance contact structures in vias configured between interconnect lines arranged on different interconnect levels.

2. Description of the Relevant Art

An integrated circuit consists of electronic devices electrically coupled by conductive trace elements, often called interconnect lines (i.e., interconnects). Interconnects are patterned from conductive layers formed on or above the surface of a silicon substrate. One or more conductive layers may be patterned to form one or more levels of interconnects vertically spaced from each other by one or more interlevel dielectric layers. Dielectric-spaced interconnect levels allow formations of densely patterned devices on relatively small surface areas. Interconnects on different levels are commonly coupled electrically using contact structures formed in vias (i.e., openings or holes etched through interlevel dielectric layers separating the interconnects).

The operating speed of an integrated circuit is limited by transistor switching times and signal propagation delays associated with signal lines along one or more critical signal paths through the circuit. A signal line formed between input/output terminals of an integrated circuit comprises interconnects, arranged on one or more levels, connected by contact structures (i.e., contacts) disposed between the interconnect levels. Resistance of each signal line is equal to the sum of the resistance values of the interconnect lines and the contacts making up the signal line. As feature sizes shrink, transistor switching times typically decrease while signal propagation delays of signal lines typically increase. In fact, the maximum operating speeds of integrated circuits with submicron feature sizes are typically limited by signal propagation delays associated with signal lines. Thus if the maximum operating speeds of integrated circuits are to increase as device dimensions shrink, the resistance values associated with interconnect lines and contacts must also be reduced to achieve the desired speed.

Following the formation and patterning of an interconnect level, an interlevel dielectric layer is deposited over the interconnect level. Prior to the formation and patterning of a subsequent interconnect level, vias are etched through the interlevel dielectric layer in locations where interconnects on different interconnect levels are to be electrically connected. Conductive material used to form a layer of interconnects is typically deposited on or above the surface of a silicon substrate by sputter deposition. As long as sputter deposition can adequately fill the vias, special via-filling procedures are not required.

In order to increase layout (i.e., packing) densities, advanced submicron fabrication technologies typically require a via-filling operation be incorporated into the process sequence prior to the deposition and patterning of subsequent interconnect levels. Following patterning of an interlevel dielectric layer to form vias, a layer of metal is typically formed over the interlevel dielectric layer until the vias are substantially filled with the metal. Portions of the metal layer over the interlevel dielectric layer are then removed. The remaining portions of the metal layer bounded exclusively within the vias form electrical contact structures between interconnects on different levels.

The metal tungsten (W) is commonly used to form metal "plugs" within the vias. Tungsten, however, does not adhere well to most common dielectric materials (e.g., silicon dioxide) used to form interlevel dielectric layers. As a result, a layer of titanium nitride (TiN) is typically deposited over an interlevel dielectric layer following patterning of the interlevel dielectric layer to form vias and prior to deposition of a W layer. The TiN layer becomes a "nucleating surface" for the subsequently deposited W layer, and the W layer adheres well to the TiN-coated interlevel dielectric layer. The W layer is deposited over the TiN layer to a thickness so as to substantially fill the vias. Portions of the W and TiN layers over substantially horizontal surfaces of the interlevel dielectric layer are then removed. The remaining portions of the W and TiN layers are bounded within the vias.

During TiN deposition, loose particles of TiN are sometimes formed which end up upon the exposed upper surfaces of semiconductor substrates. A portion of these TiN particles come to rest over via openings, preventing various chemically reactive species from entering the vias for the remainder of the TiN deposition period. As a result, TiN adhesion layers of adequate thickness are often not formed upon sidewalls and bottom surfaces of vias with openings blocked by TiN particles. Even if the TiN particles are removed from over the openings of vias after TiN deposition and before W deposition, W reactant species introduced during the subsequent W depositions will not adhere to the sidewalls and bottom surfaces of the vias due to the lack of adequate TiN adhesion layers. As a result, adequate W material is not deposited within affected vias, and the contact structures formed within affected vias display high electrical resistances. The integrated circuits containing such high resistance contact structures typically fail to meet performance requirements and must be rejected, lowering the yield of the wafer fabrication process.

It would thus be advantageous to have a method for consistently forming low resistance contact structures which ensures adequate TiN adhesion layer thickness despite the occurrences of TiN particles which block via openings during TiN depositions. The desired method would consistently produce low resistance contact structures by ensuring adequate plug material deposition within the vias. The number of integrated circuits which fail to meet performance requirements would be reduced, thereby increasing wafer fabrication process yields.

SUMMARY OF THE INVENTION

The problems outlined above are in large part solved by a method for consistently forming low resistance contact structures in vias formed through an interlevel dielectric to underlying interconnect lines. A two-step adhesion layer deposition process with an intermediate particle removing step is employed to ensure sidewalls and bottom surfaces of vias are adequately covered with adhesion layer material prior to via plug formation. Two separate layers of an adhesion layer material (e.g., TiN) are deposited, each layer having a thickness which is adequate for that layer to act as a nucleating surface for subsequently deposited via plug material (e.g., W). The particle removing step is performed following deposition of a first adhesion layer. During the particle removing step, particles of the adhesion layer material are removed from the upper surface of the first adhesion layer, including particles blocking via openings. Following the particle removing step, a second adhesion layer is deposited over the first adhesion layer and any remaining exposed surfaces of the interconnect dielectric layer not covered by the first adhesion layer. The two-step adhesion layer deposition process substantially reduces the probability that a given via will be blocked by a particle of the adhesion layer material. As a result, the two-step deposition process is very effective in ensuring sidewalls and bottom surfaces of vias are adequately covered by adhesion layer material. Fewer high resistance contact structures are formed, and yields of wafer fabrication processes are increased.

A second particle removing step is preferably performed after deposition of the second adhesion layer. Each particle removing step may be accomplished using, for example, a mechanical scrubbing or polishing process. During such a process, a pad is placed in contact with the upper surface of the adhesion layer. Relative motion between the pad and the upper surface of the adhesion layer causes particles of the adhesion layer material residing on the surface of the adhesion layer to be picked up by the pad. Alternately, the particle removing step may be accomplished by subjecting the upper surface of the adhesion layer to a flow of an inert gas (i.e., a gas which does not chemically react with the adhesion layer material). Such inert gases include filtered air and nitrogen. In this case, the particles of the adhesion layer material are swept up in the flow of inert gas and removed from the upper surface of the adhesion layer.

A method for forming a contact structure in accordance with the present invention includes selectively removing a portion of an interlevel dielectric layer formed over a contact point (i.e., forming a via through the interlevel dielectric layer). A first layer of an adhesion layer material is deposited upon the interlevel dielectric layer and within the via opening. Particles of adhesion layer material are removed from an upper surface of the first layer of the adhesion layer material, including any particle over the via opening. A second layer of the adhesion layer material is deposited upon the upper surface of the first layer of the adhesion layer material and within the via opening. A second particle removal step is preferably performed to remove particles from an upper surface of the second layer of the adhesion layer material. A layer of a metal (e.g., via plug material W) is then deposited such that the metal substantially fills the via. Portions of the metal layer, the second layer of the adhesion layer material, and the first layer of the adhesion layer material existing above an upper surface of the interlevel dielectric are then removed. The remaining portions of the W and TiN layers fill the via, forming a low resistance contact structure. The resulting contact structure may be used to electrically couple interconnect lines arranged on different interconnect levels.

BRIEF DESCRIPTION OF THE DRAWINGS

Other objects and advantages of the invention will become apparent upon reading the following detailed description and upon reference to the accompanying drawings in which.

Figure 1:
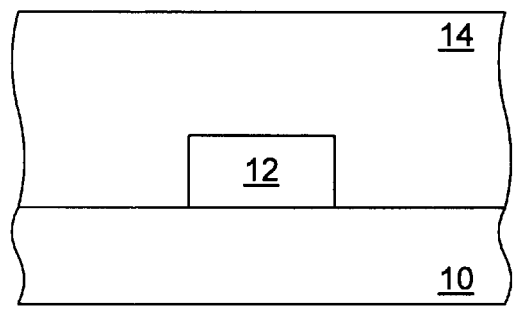
FIG. 1 is a partial cross-sectional view of an upper topography of a silicon substrate, wherein a contact point (e.g., an interconnect) is formed upon and within the upper topography, and wherein an interlevel dielectric layer is formed over the interconnect and the upper surface of the upper topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIGS. 1–9 will be used to describe the present apparatus and method for consistently forming low resistance contact structures in vias between interconnects. FIG. 1 is a partial cross-sectional view of an upper topography 10 of a silicon substrate. Upper topography 10 may be an upper surface of the silicon substrate, or an exposed surface above a number of alternating dielectric and interconnect layers formed upon an upper surface of the silicon substrate. Formed upon upper topography 10 is an interconnect 12, as well as an interlevel dielectric layer 14 which resides over interconnect 12 and upper topography 10. Interconnect 12 is typically formed from an electrically conductive layer comprising, for example, aluminum or doped polycrystalline silicon. Interlevel dielectric layer 14 is preferably a silicon dioxide (i.e., oxide) layer. Alternately, interlevel dielectric layer 14 may be, for example, a silicon nitride layer or a layer of a polyimide material.

It is noted that the upper surface of interconnect 12 represents only one of many possible contact points. For example, the upper surface of the silicon substrate may have a doped region therein, and the desired contact point may be the upper surface of the silicon substrate within the doped region. For clarity and brevity in the drawings, the upper surface of interconnect 12 will be considered the desired contact point.

Figure 2:
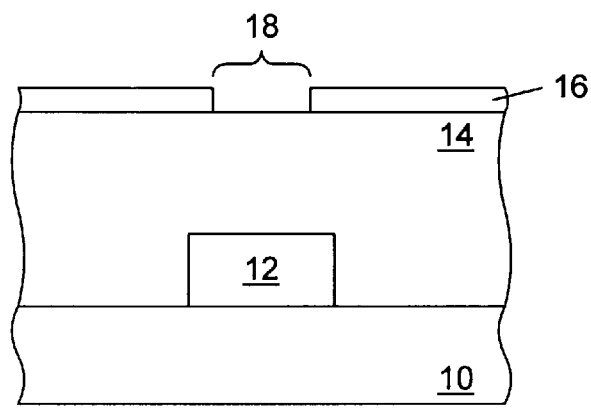
FIG. 2 is a partial cross-sectional view the upper topography following exposure and development of a photoresist layer applied over the interlevel dielectric layer in order to define a via location.

FIG. 2 is a partial cross-sectional view of upper topography 10 following application, exposure, and development of a photoresist layer 16 in order to define a via location. A preferred method of applying photoresist layer 16 to the upper surface of interlevel dielectric layer 14 is by using a spin-coat process. In a photoresist spin-coat process, the silicon substrate is typically held on a vacuum chuck. A sufficient amount of liquid photoresist material is then deposited near the center of the upper surface of interlevel dielectric layer 14, and allowed to spread out into a puddle. When the puddle reaches a predetermined diameter, the substrate and vacuum chuck are sent into a rotating motion about an axis near the center of and normal to the upper surface of interlevel dielectric layer 14. The substrate and vacuum chuck are rapidly accelerated to a predetermined rotational speed. Centrifugal forces spread the photoresist material from the center of the upper surface of interlevel dielectric layer 14 to an edge. Excess photoresist material is thrown off of the edge of the upper surface of interlevel dielectric layer 14. A substantially even flow of photoresist material is thus achieved across the upper surface of interlevel dielectric layer 14.

During the developing step, portions of photoresist layer 16 are removed where vias are to be formed through interlevel dielectric layer 14. In FIG. 2, a portion of photoresist layer 16 is removed over via location 18.

Figure 3:
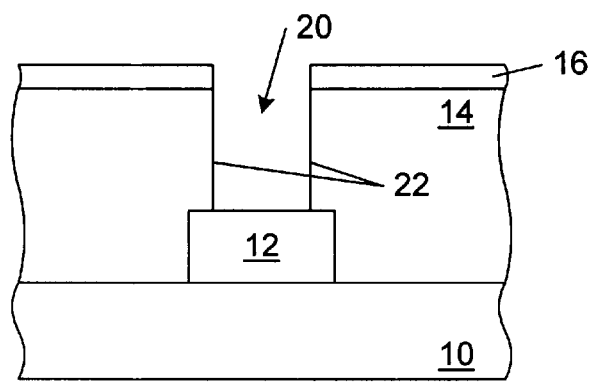
FIG. 3 is a partial cross-sectional view of the upper topography following etch removal of a portion of the interlevel dielectric layer to form a via.

Following photolithographic exposure and development, exposed portions of interlevel dielectric layer 14 are subjected to an etchant during an etching step in order to form vias. The remaining portions of photoresist layer 16 are resistant to the etchant and serve to protect the underlying portions of interlevel dielectric layer 14. The etching step preferably involves subjecting the exposed upper surface of interlevel dielectric layer 14 to dry chemical etchant (i.e., dry etching). Alternately, the etching step may involve subjecting the exposed upper surface of interlevel dielectric layer 14 to a liquid etchant (i.e., wet etching). Etchants are well known in the art. The etchant is suitably chosen to selectively remove the portions of interlevel dielectric layer 14 not covered by the remaining portions of photoresist layer 16 without adversely affecting the portions of interlevel dielectric layer 14 protected by the overlying remaining portions of photoresist layer 16. FIG. 3 is a partial cross-sectional view of upper topography 10 following etching removal of portions of interlevel dielectric layer 14 in order to form vias. During the etching step, via 20 is formed through interlevel dielectric layer 14 to interconnect 12. It is noted that via 20 has substantially vertical sidewalls 22.

A suitable dry etch processes is a plasma etch process. During a plasma etch process, the silicon substrate is placed in a reaction chamber containing one or more reactant gases. A glow discharge (i.e., a plasma) is formed when radio frequency (RF) power is applied between a pair of electrodes within the chamber (planar plasma etching) or to a coil surrounding the chamber (inductively coupled plasma etching). The reactant gases produce chemically reactive species (atoms, ions, and radicals) which diffuse to the exposed upper surface of interlevel dielectric layer 14 and are adsorbed. A chemical reaction occurs, with the formation of volatile by-products. These by-products are desorbed from the exposed upper surface of interlevel dielectric layer 14 and diffuse into the ambient.

Figure 4:
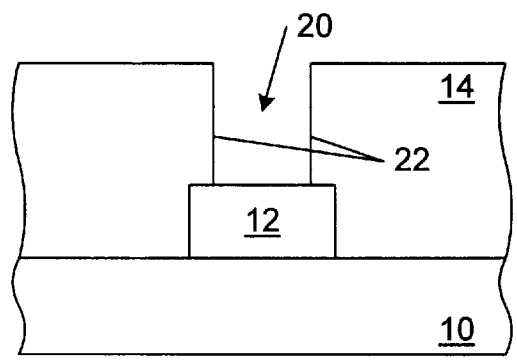
FIG. 4 is a partial cross-sectional view of the upper topography following removal of the remaining portion of the photoresist layer.

Following the etching step, the remaining portion of photoresist layer 16 is removed. The remaining portion of photoresist layer 16 is preferably oxidized in a chamber containing an oxygen-rich ambient (e.g., plasma downstream strip process). Such oxidation is termed a dry resist strip process. Alternately, the remaining portion of photoresist layer 16 may be dissolved using a liquid stripping agent during a wet resist strip process. FIG. 4 is a partial cross-sectional view of upper topography 10 following removal of the remaining portion of photoresist layer 16.

An organic solvent rinse may be carried out following the resist strip process. The organic solvent rinse may be accomplished by spraying an organic photoresist solvent on the upper surface of the upper topography, or by immersing the silicon substrate in an organic photoresist solvent. An isopropyl alcohol rinse may then be used to remove traces of the organic solvent.

Figure 5:
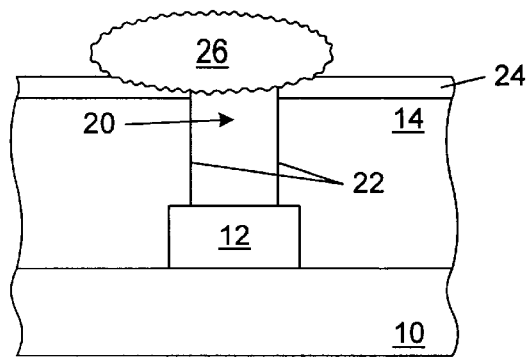
FIG. 5 is a partial cross-sectional view of the upper topography following formation of a first TiN layer over the exposed surface of the interlevel dielectric layer, wherein the first TiN layer is deposited to a thickness greater than or equal to a minimum thickness which allows the first TiN layer to act as a nucleating surface for a subsequently formed W layer, and wherein a TiN particle formed during deposition of the first TiN layer comes to rest upon the upper surface of the upper topography over an opening of the via.

Following the resist strip process, a first TiN layer 24 is formed over exposed surfaces of interlevel dielectric layer 14 in order to improve the adhesion of a subsequently formed W layer. FIG. 5 is a partial cross-sectional view of upper topography 10 following formation of first TiN layer 24 over the exposed surface of interlevel dielectric layer 14. First TiN layer 24 is ideally formed upon sidewalls 22 of via 20 and the exposed upper surface of interconnect 12 at the bottom of via 20 in addition to the exposed upper surface of interlevel dielectric layer 14. First TiN layer 24 is deposited to a thickness greater than or equal to a minimum thickness which allows first TiN layer 24 to act as a nucleating surface for the subsequently formed W layer. For example, first TiN layer 24 may be deposited to a thickness greater than or equal to a minimum thickness of 300 angstroms. The deposition of first TiN layer 24 may be accomplished using common evaporation, sputtering, or chemical vapor deposition (CVD) processes.

A suitable sputter deposition process involves placing the silicon substrate within an evacuated reaction chamber containing a source of positively charged ions and a TiN target maintained at a negative electrical potential relative to the ion charge. The positively charged ions, having sufficient energy to dislodge atoms from the TiN target, are directed at the TiN target. Dislodged (i.e., sputtered) TiN atoms settle on everything in the reaction chamber, including the exposed surfaces of interlevel dielectic layer 14. The TiN atoms which settle upon the exposed surfaces of interlevel dielectric layer 14 then condense to form first TiN layer 24.

During formation of first TiN layer 24, a TiN particle 26 of relatively large dimension may be formed. TiN particle 26 may unfortunately end up on the upper surface of upper topography 10 over an opening of via 20 as shown in FIG. 5. It is postulated that such TiN particles are either formed above upper topography 10 or flake off of the surfaces of chambers in which TiN depositions are performed, and fall onto the upper surface of upper topography 10. Access to sidewalls 22 of via 20 and the exposed upper surface of interconnect 12 at the bottom of via 20 by various chemically reactive species during the remainder of the TiN deposition is prevented by the presence of TiN particle 26 over the opening of via 20. As a result, the thickness of any portion of first TiN layer 24 formed upon sidewalls 22 of via 20 and the exposed upper surface of interconnect 12 at the bottom of via 20 is less than the minimum thickness required for W nucleation.

Figure 6:
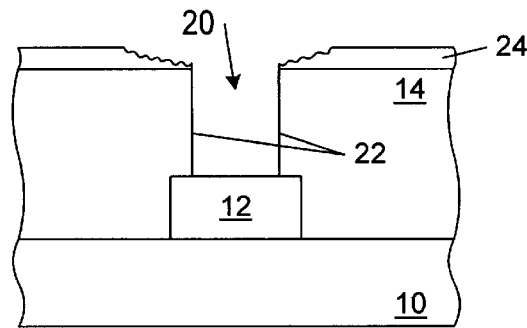
FIG. 6 is a partial cross-sectional view of the upper topography following a TiN particle removing step, during which the TiN particle is removed from over the via opening.

Following the formation of first TiN layer 24, TiN particles upon the upper surface of upper topography 10 are removed. During this TiN particle removing step, TiN particle 26 is removed from over the opening of via 20. The TiN particle removing process will be described in detail below. FIG. 6 is a partial cross-sectional view of the upper topography following the removing step during which TiN particle 26 is removed from over the opening of via 20.

Figure 7:
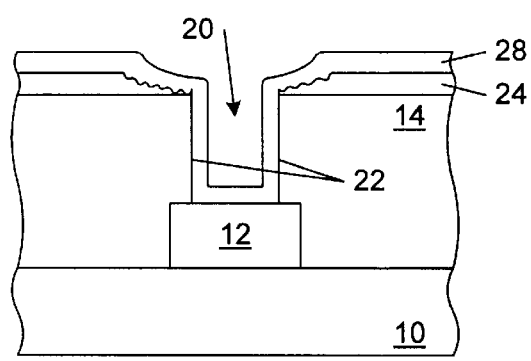
FIG. 7 is a partial cross-sectional view of the upper topography following formation of a second TiN layer over the first TiN layer and any remaining exposed surfaces of the interlevel dielectric layer not covered by the first TiN layer.

Following removal of TiN particles from the upper surface of upper topography 10, a second TiN layer 28 is formed over first TiN layer 24 and any remaining exposed surfaces not covered by first TiN layer 24. FIG. 7 is a partial cross-sectional view of upper topography 10 following formation of second TiN layer 28 over first TiN layer 24 and any remaining exposed surfaces of interlevel dielectric layer 14 not covered by first TiN layer 24. Second TiN layer 28 is deposited to a thickness greater than or equal to the minimum thickness which allows second TiN layer 28 alone to act as a nucleating surface for the subsequently formed W layer. Second TiN layer 28 is preferably deposited to the same thickness as areas which receive first TiN layer 24. In FIG. 7, second TiN layer 28 covers first TiN layer 24 and exposed surfaces not covered, due to TiN particle coverage, by first TiN layer 24, namely sidewalls 22 of via 20 and the exposed upper surface of interconnect 12 at the bottom of via 20. Following the formation of second TiN layer 28, any TiN particles upon the upper surface of upper topography 10 are again removed as will be described in detail below.

Figure 8:
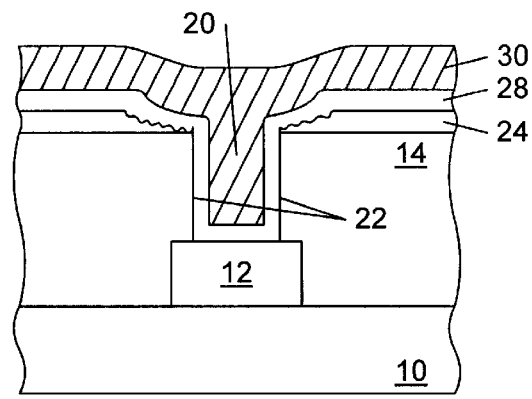
FIG. 8 is a partial cross-sectional view of the upper topography following a second TiN particle removal operation and subsequent formation of a W layer over the second TiN layer.

A W layer is then deposited over second TiN layer 28. FIG. 8 is a partial cross-sectional view of upper topography 10 following a second TiN particle removal operation and subsequent formation of a W layer 30 over second TiN layer 28. W layer 30 is deposited to a thickness so as to substantially fill via 20. W layer 30 is preferably formed using a CVD process. Alternately; W layer 30 may be formed using well known sputter or evaporation deposition techniques.

A suitable CVD process involves placing the silicon substrate in a CVD reaction chamber containing tungsten hexafluoride ($WF_6$) and hydrogen ($H_2$), increasing the temperature inside the reaction chamber to between 350° C. and 450° C., and reducing the pressure inside the reaction chamber. A layer of W is thus formed upon second TiN layer 28 according to the following reaction:

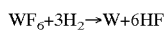

Portions of W layer 30, second TiN layer 28, and first TiN layer 24 are then removed from the upper surface of interlevel dielectric layer 14. Removal of the portions of the W and TiN layers over interlevel dielectric layer 14 is preferably accomplished using a chemical-mechanical polish (CMP) operation. Alternately, the W and TiN layers may be removed using any of several well know etch processes (e.g., plasma etch).

During a suitable CMP process, the silicon substrate is held on a vacuum chuck of a CMP tool. A polishing pad of the CMP tool, saturated with an abrasive slurry solution, is pressed against the exposed upper surface of the silicon substrate. The polishing pad and the vacuum chuck are then caused to rotate in opposite directions by an electrical motor. Features on the upper surface of the silicon substrate are removed by polishing via movement of the polishing pad relative to the upper surface of the silicon substrate.

Figure 9:
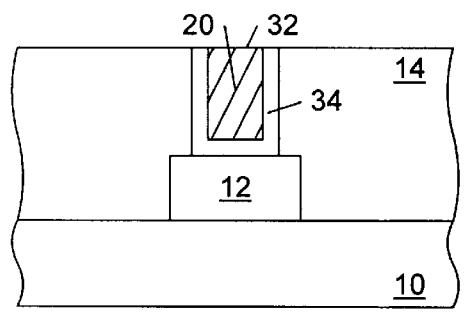
FIG. 9 is a partial cross-sectional view of the upper topography following removal of portions of the W layer, the second TiN layer, and the first TiN layer from the upper surface of the interlevel dielectric layer.

FIG. 9 is a partial cross-sectional view of upper topography 10 following removal of portions of W layer 30, second TiN layer 28, and first TiN layer 24 from the upper surface of interlevel dielectric layer 14. In FIG. 9, a remaining portion 32 of W layer 30 and a remaining portion 34 of second TiN layer 28 fill via 20 to form a contact structure. The resulting low resistance contact structure may be used to electrically couple interconnect line 12 to an interconnect line on a subsequently formed interconnect level.

The two-step adhesion layer deposition process substantially reduces the probability that the opening of via 20 will be blocked by a TiN particle. As a result, the two-step TiN deposition with intermediate TiN particle removing step is highly effective in ensuring sidewalls 22 of via 20 and the exposed upper surface of interconnect 12 at the bottom of via 20 are covered by a TiN layer of adequate thickness to act as a nucleating surface for the subsequently formed W layer. The occurrence of TiN particle 26 during a single TiN deposition step would most likely have resulted in a high resistance contact structure being formed within via 20, causing the integrated circuit containing via 20 to fail to meet performance requirements.

Figure 10:
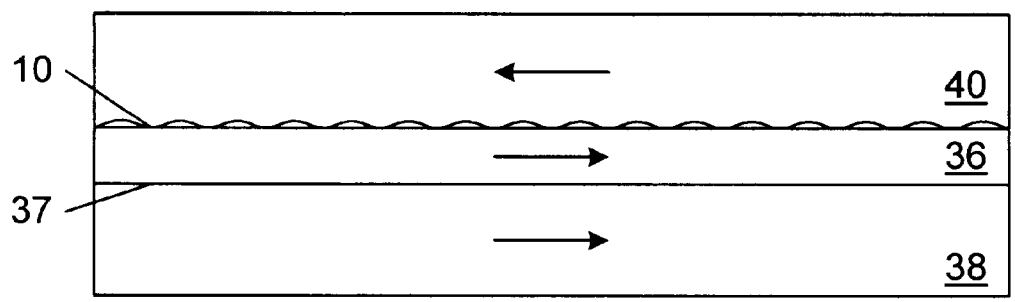
FIG. 10 is a side elevation view of the silicon substrate including the upper topography undergoing one embodiment of the removing step involving mechanical scrubbing or polishing.

Removal of TiN particles from the exposed upper surface of upper topography 10 may be accomplished using a mechanical scrubbing or polishing operation. FIG. 10 is a side elevation view of a silicon substrate 36 including upper topography 10 undergoing a mechanical scrubbing or polishing operation. During the mechanical scrubbing or polishing operation, a backside surface 37 of silicon substrate 36 is held against a flat surface of a vacuum chuck 38. A scrubbing or polishing pad 40 is pressed against the exposed upper surface of upper topography 10 of the silicon substrate. Scrubbing or polishing pad 40 and vacuum chuck 38 are then caused to rotate in opposite directions by an electrical motor. TiN particles on the upper surface of upper topography 10 are removed from upper topography 10 and picked up within scrubbing or polishing pad 40 via movement of scrubbing or polishing pad 40 relative to the upper surface of upper topography 10.

Figure 11:
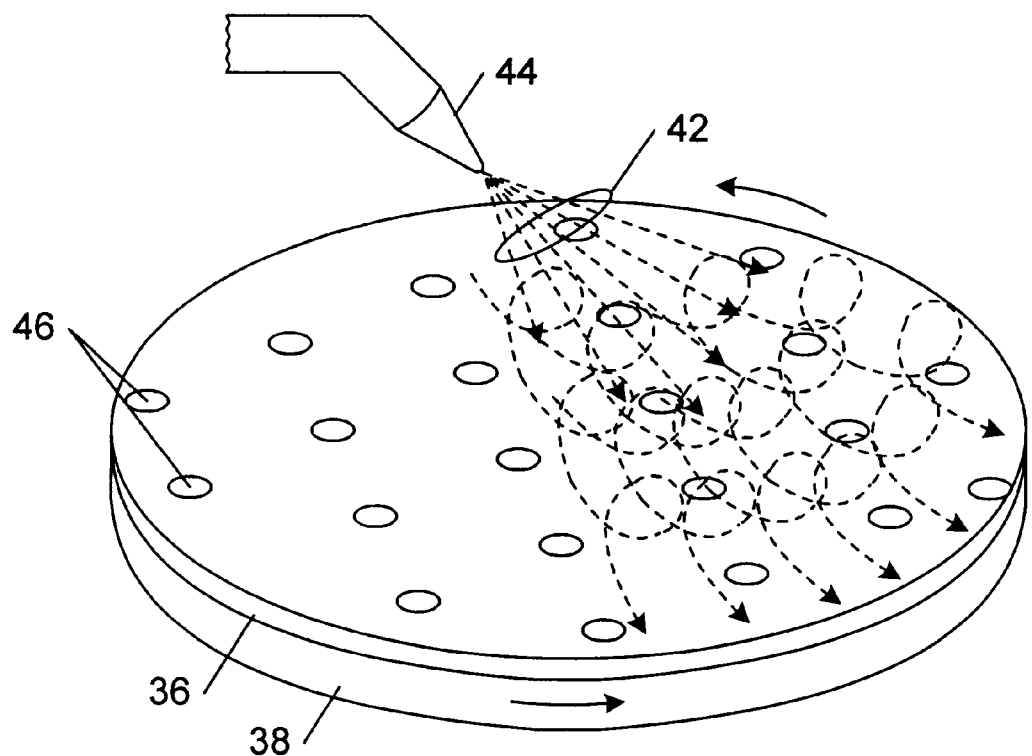
FIG. 11 is an isometric view of the silicon substrate including the upper topography undergoing another embodiment of the removing step involving subjecting the upper surface of the upper topography to a flow of an inert gas.

Alternately, TiN particle removal may be accomplished by subjecting the upper surface of upper topography 10 to a flow of an inert gas. FIG. 11 is an isometric view of silicon substrate 36 including upper topography 10 being subjected to a flow of an inert gas 42 delivered by a nozzle 44. Suitable inert gases do not chemically react with TiN, and include filtered air and nitrogen ($N_2$). During such a TiN particle removal operation, the backside surface of silicon substrate 36 is again held against a flat surface of a vacuum chuck 38, and vacuum chuck 38 is caused to rotate. Nozzle 44 delivers flow of inert gas 42 across the upper surface of upper topography 10 as shown. TiN particles on the upper surface of upper topography 10, including any TiN particles over openings to vias 46, are swept up in flow of inert gas 42 and removed from upper topography 10.

It will be appreciated by those skilled in the art having the benefit of this disclosure that this invention is believed to be an apparatus and method for consistently forming low resistance contact structures involving the removal of adhesion layer particles blocking via openings. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming a contact structure within an interlevel dielectric layer, comprising:

providing an interlevel dielectric having an opening formed through a localized region of the interlevel dielectric;

depositing a first layer of an adhesion layer material upon the interlevel dielectric and within the opening, wherein the adhesion layer material includes particulate matter;

removing the particulate matter from an upper surface of the first layer of the adhesion layer material; and depositing a second layer of the adhesion layer material upon the upper surface of the first layer of the adhesion layer material and within the opening absent depositing any material within said opening in the interim between said depositing steps.

2. The method as recited in claim 1, wherein the adhesion layer material comprises titanium nitride (TiN).

3. The method as recited in claim 1, wherein the first layer of the adhesion material is deposited to a thickness greater than or equal to a minimum thickness which allows the first layer of the adhesion material to act as a nucleating surface for subsequently deposited via plug material.

4. The method as recited in claim 3, wherein the first layer of the adhesion material is deposited to a thickness greater than or equal to 300 angstroms.

5. The method as recited in claim 1, wherein the second layer of the adhesion material is deposited to a thickness greater than or equal to a minimum thickness which allows the first layer of the adhesion material to act as a nucleating surface for subsequently formed via plug material.

6. The method as recited in claim 5, wherein the second layer of the adhesion material is deposited to a thickness greater than or equal to 300 angstroms.

7. The method as recited in claim 1, wherein during the removing step a pad is placed in contact with the upper surface of the first layer of the adhesion layer material, and wherein the removing step is accomplished by relative motion between the pad and the upper surface of the first layer of the adhesion layer material.

8. The method as recited in claim 1, wherein the removing step is accomplished by subjecting the upper surface of the first layer of the adhesion layer material to a flow of an inert gas.

9. The method as recited in claim 8, wherein the inert gas is selected from the group consisting of air and nitrogen.

10. The method as recited in claim 1, further comprising removing the particulate matter from an upper surface of the second layer of the adhesion layer material.

11. The method as recited in claim 1, wherein the removing is performed immediately following the depositing of the first layer of the adhesion layer material.

12. The method as recited in claim 1, wherein the depositing of the second layer of the adhesion layer material is performed immediately following the removing.

13. A method for forming a contact structure, comprising:

providing an interconnect line extending partially across an upper topography of a silicon substrate, and further providing an interlevel dielectric across said interconnect line and said upper topography;

applying a photoresist layer across said interconnect line and said interlevel dielectric;

selectively removing said photoresist layer and underlying said interlevel dielectric such that an opening is formed through the interlevel dielectric to the interconnect line;

depositing a first layer of titanium nitride (TIN) upon the interlevel dielectric and within the opening such that the first layer of TiN is in physical contact with the interlevel dielectric, wherein said depositing results in TiN particulate matter present upon an upper surface of said first layer of TiN;

removing the TiN particulate matter from the upper surface of the first layer of TiN, wherein TiN particulate matter over the opening is removed; and depositing a second layer of TiN upon the upper surface of the first layer of TiN and within the opening.

14. The method as recited in claim 13, wherein the first layer of TiN is deposited to a thickness greater than or equal to a minimum thickness which allows the first layer of TiN to act as a nucleating surface for subsequently deposited via plug material.

15. The method as recited in claim 13, wherein the second layer of TiN is deposited to a thickness greater than or equal to a minimum thickness which allows the first layer of TiN to act as a nucleating surface for subsequently formed via plug material.

16. The method as recited in claim 13, wherein during the removing step a pad is placed in contact with the upper surface of the first layer of TiN, and wherein the removing step is accomplished by relative motion between the pad and the upper surface of the first layer of TiN.

17. The method as recited in claim 13, wherein the removing step is accomplished by subjecting the upper surface of the first layer of the adhesion layer material to a flow of an inert gas.

18. The method as recited in claim 13, further comprising removing the particulate matter from an upper surface of the second layer of the adhesion layer material.

19. The method as recited in claim 13, further comprising:

depositing a layer of a metal upon the second layer of TiN; and removing portions of the metal layer, the second layer of TiN, and the first layer of TiN existing above an upper surface of said interlevel dielectric.

20. The method as recited in claim 19, wherein the metal comprises tungsten (W).

21. The method as recited in claim 19, wherein the removing of portions of the metal layer comprises chemical-mechanical polishing.

22. The method as recited in claim 13, wherein the removing of the TiN particulate matter is performed immediately following the depositing of the first layer of TiN.

23. The method as recited in claim 13, wherein the depositing of the second layer of TiN is performed immediately following the removing of the TiN particulate matter.

* * * * *

UNITED STATES PATENT AND TRADEMARK OFFICE
CERTIFICATE OF CORRECTION

PATENT NO. : 5,980,979
DATED : November 9, 1999
INVENTOR(S) : Don R. Rohner

It is certified that error appears in the above-identified patent and that said Letters Patent is hereby corrected as shown below:

Claim 17, col. 10, line 37, please delete "the adhesion layer material" and substitute therefor --TiN--.

Claim 18, col. 10, line 41, please delete "the adhesion layer material" and substitute therefor --TiN--.

Signed and Sealed this

Fifteenth Day of August, 2000

Attest:

Q. TODD DICKINSON

Attesting Officer       Director of Patents and Trademarks